United States Patent

Hosomi et al.

[11] Patent Number: 6,049,130
[45] Date of Patent: *Apr. 11, 2000

[54] SEMICONDUCTOR DEVICE USING GOLD BUMPS AND COPPER LEADS AS BONDING ELEMENTS

[75] Inventors: Eiichi Hosomi, Kawasaki; Hiroshi Tazawa, Ichikawa; Chiaki Takubo, Tokyo-to; Koji Shibasaki, Kawasaki, all of Japan

[73] Assignee: Kabushiki Kaisha Toshiba, Kawasaki, Japan

[ * ] Notice: This patent is subject to a terminal disclaimer.

[21] Appl. No.: 08/853,475

[22] Filed: May 9, 1997

Related U.S. Application Data

[63] Continuation of application No. 08/593,622, Jan. 30, 1996, Pat. No. 5,747,881.

[30] Foreign Application Priority Data

Feb. 1, 1995 [JP] Japan .................................. 7-35959
Dec. 12, 1995 [JP] Japan .................................. 7-346405

[51] Int. Cl.[7] .............................. H01L 23/48; H01L 23/52
[52] U.S. Cl. ......................... 257/750; 257/736; 257/737; 257/738; 257/762; 257/748; 257/772; 257/778; 438/119; 438/120; 438/613; 438/665
[58] Field of Search ................................. 257/736, 737, 257/738, 750, 762, 778, 748, 772; 438/119, 120, 613, 665

[56] References Cited

U.S. PATENT DOCUMENTS 4,634,638  1/1987  Ainslie et al. .
5,463,245  10/1995  Hiruta .
5,545,589  8/1996  Tomura et al. ..................... 438/119
5,747,881  5/1998  Hosomi et al. ..................... 257/736

OTHER PUBLICATIONS

Hosomi, E. et al., "A New Bonding Mechanism of 50 μm Pitch TAB–ILB with 0.25 μm Sn Plated Cu Lead" Proceedings of the Electronic Components & Technology Conference, Las Vegas, Nevada, May 21–24, 1995, pp. 851–856.

Lai, J.K.L., et al., "Effects of Bond Temperature and Pressure on Microstructures of Tape Automated Bonding (TAB) Inner Lead Bonds (ILB) with Thin Tape Metallization," Proceedings of the Electronic Components & Technology Conference, Las Vegas, Nevada, May 21–24, 1995, pp. 819–826.

Zakel, E. et al., "Degradation of TAB Outer Lead Contacts Due to the Au–Concentration in Eutectic Tin/Lead Solder," Proceedings of the Japan International Electronic Manufacturing Technology Symposium, Kanazawa, Japan, Jun. 9–11, 1993 pp. 322–329.

Zakel, E. et al., "Au–SN Bonding Metallurgy of TAB Contracts and Its Influence on the Kirkendall Effect in the Ternary Cu–Au–Sn System," Proceedings of the Electronic Components & Technology Conference, San Diego, CA, May 18–20, 1992, pp. 360–371.

Zakel, E. et al., "Investigations of Failure Mechanisms of Tab–Bonded Chips During Thermal Aging," Proceedings of the Electronic Components & Technology Conference, Las Vegas, Nevada, May 20–23, 1990 pp. 450–459.

Primary Examiner—Fetsum Abraham
Attorney, Agent, or Firm—Finnegan, Henderson, Farabow, Garrett & Dunner, L.L.P.

[57] ABSTRACT

A semiconductor device comprises a semiconductor chip, an Au bump formed on the semiconductor chip, and Cu lead bonded to the Au bump through a bonding part. The Cu lead has a Cu core and a plated Sn layer formed on the Cu core, and the bonding part is formed of an Au-rich Au—Cu—Sn alloy of a ternary system having a single-phase structure containing 15 at. % or less Sn and 25 at. % or less Cu.

3 Claims, 10 Drawing Sheets

SEMICONDUCTOR DEVICE USING GOLD BUMPS AND COPPER LEADS AS BONDING ELEMENTS

This is a continuation of application Ser. No. 08/593,622, filed Jan. 30, 1996, U.S. Pat. No. 5,747,881, issued May 5, 1998.

BACKGROUND OF THE INVENTION

1. Field of the Invention

This present invention relates to a semiconductor device provided comprising a semiconductor chip, gold (Au) bumps and copper (Cu) leads, a method of fabricating such a semiconductor device, and Cu leads. More specifically, the present invention relates to a semiconductor device that enables firm bonding of Au bumps to Cu leads, a method of fabricating such a semiconductor device, and Cu leads.

2. Description of the Related Art

Figure 20:
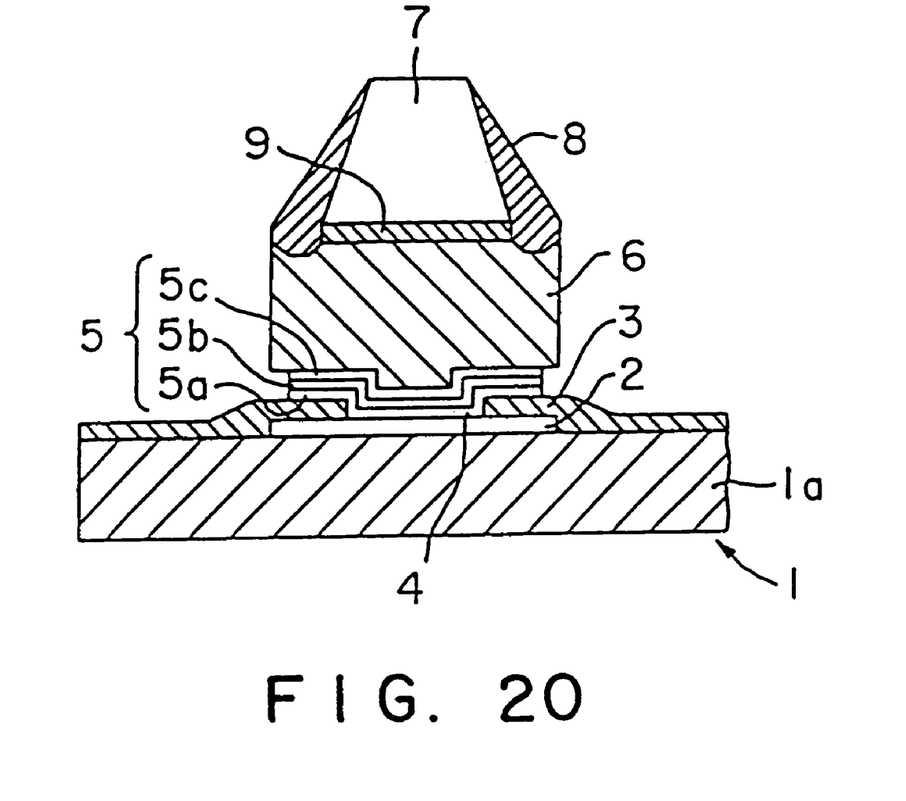
FIG. 20 is a fragmentary sectional view of a conventional semiconductor device.

The semiconductor chip of a conventional semiconductor device to be connected to leads by a tape-automated bonding method (TAB method) generally is provided with bumps, i.e., metal electrodes, on electrode pads. As shown in FIG. 20, a conventional semiconductor device 1 has a semiconductor chip 1a provided with electrode pads 2. In FIG. 20, only one of the electrode pads 2 is shown. The surface of the semiconductor chip 1a on which the electrode pads 2 are formed is coated entirely with a passivation film 3 of $Si_3N_4$ or $SiO_2$, and the surfaces of the electrode pads 2 are exposed partially through openings 4 formed in the passivation film 3, respectively.

A barrier metal layer 5 is formed so as to cover the exposed portion of each electrode pad 2, and an area of the passivation film 3 around the edge of the opening 4.

Generally, the barrier metal layer 5 consists of a plurality of metal thin films. The barrier metal layer 5 shown in FIG. 20 by way of example is formed by sequentially forming a first barrier metal layer 5a of titanium (Ti), a second barrier metal layer 5b of nickel (Ni) and a third barrier metal layer 5c of palladium (Pd). A bump 6 is formed on the third barrier metal layer 5c. Generally, the bumps 6 of semiconductor devices to be mounted on a TAB tape by a TAB method are formed of Au.

As shown in FIG. 20, an inner lead 7, i.e., a portion of a Cu lead of a TAB tape, is bonded to the bump 6 by a bonding process, i.e., an inner lead bonding process (ILB process). The Cu leads are coated with a 0.4 to 0.6 μm thick plated tin (Sn) layer.

The Cu lead coated with the plated Sn layer has an inner lead 7 and an outer lead. The thickness of a portion of the plated Sn layer on the side of the outer lead of the Cu lead must be sufficiently large for reliable outer lead bonding; otherwise Cu appears on the surface of the outer lead, which will lead to entailing problems in oxidation of Cu and then less wettability during bonding. Therefore, the thickness of the plated Sn layer coating the outer lead of the Cu lead must be in the range of 0.4 to 0.6 μm, and hence, generally, the thickness of the plated Sn layer on the inner leads is in the range of 0.4 to 0.6 μm as mentioned above.

When bonding together the inner lead 7 and the Au bump 6 by inner lead bonding (ILB), the the inner lead 7 is brought into contact with the Au bump 6, and then heat and pressure are applied to the interface between the inner lead 7 and the Au bump 6. When the inner lead 7 and the Au bump 6 are thus bonded together, fillets 8 are formed on the side surfaces of the inner lead 7, and an alloy layer 9 is formed in the interface between the inner lead 7 and the Au bump 6. The fillet 8 and the alloy layer 9 secure the bonding strength between the inner lead 7 and the Au bump 6.

Incidentally, the fillet 8 and the alloy layer 9 formed when the Au bump 6 and the inner lead 7 coated with the plated Sn layer are bonded together are formed of An Au—Sn alloy; the fillet 8 is formed mainly of a eutectic Au—Sn alloy (70.7 at. % Au and 29.3 at. % Sn (M. Hansen, "Contribution of Binary Alloys", Genium Publishing Corp., New York (1985)), and the alloy layer 9 is formed of a eutectic Au-Sn alloy or a zeta-phase Au-Sn alloy (84 to 88 at. % Au and 12 to 16 at. % Sn) (Bike Zakel, et al., 42nd ECTC Proceeding, pp.360–371, (1992)). The alloy layer 9 is formed of such an Au—Sn alloy because the plated Sn layer coating the inner lead 7 has a comparatively large thickness of 0.4 to 0.6 μm and and hence it is difficult for Cu forming the inner lead 7 to appear on the surface of the plated Sn layer.

The semiconductor device is subjected to accelerated durability tests, i.e., reliability tests, to evaluate the reliability of the bonding parts. A high-temperature stability test is a representative accelerated durability tests. The high-temperature stability test uses a property of metals that the diffusion rate of metals at a high temperature is higher than that at an ordinary temperature. During the high-temperature stability test, Cu forming the inner lead 7 diffuses into the fillets 8 formed on the side surfaces of the inner lead, forming voids (defects) in the Cu inner lead 7 by the Kirkendall effect. According to studies made by Zakel, et al., Cu forming the inner lead 7 diffuses into the alloy layer 9, causing the alloy layer 9 originally being of an Au—Sn alloy of a binary alloy system to change into an Au—Cu—Sn alloy of a ternary alloy system.

When the alloy layer 9 changes into such an alloy of a ternary alloy system, voids are formed in the surface of the inner lead 7 on the side of the semiconductor chip 1a due to the Kirkendall effect. If the voids grows, it is possible that the inner lead 7 is disconnected from the Au bump 6.

Zakel, et al. made a detailed report on the condition of bonding parts formed by ILB after the bonding parts had been kept in a high-temperature environment in Elke Zakel, et al., 42nd ECTC Proceeding, pp. 360–371 (1992). In experiments conducted by Zakel, et al., the plated Sn layer coating the inner lead 7 of a TAB tape was formed in a thickness of 0.7 μm by an electroplating process, the heating temperature for ILB was 400 to 500° C. and the ILB pressure applied to the bumps was 10 or 40 cN (10 or 40 gf). When the ILB pressure is comparatively low, a eutectic Au—Sn alloy is formed in the alloy layer 9. During the high-temperature stability test, Cu of the inner leads 7 diffuses into eutectic Au—Sn portions of the alloy layer 9, and voids are formed by the Kirkendall effect when the Au-Sn alloy changes into an Au—Cu—Sn alloy.

It is said that a zeta phase is formed mainly in the alloy layer 9 and Cu of the inner lead 7 does not diffuse into the alloy layer 9 during the high-temperature stability test when the ILB pressure is comparatively high, which is inferred to be due the extrusion of the eutectic Au—Sn alloy formed during ILB from the bonding part by the comparatively high ILB pressure and the resultant formation of a zeta phase in which the Sn content is comparatively small. Zakel, et al. concluded that the zeta phase thus formed serves as a barrier against the diffusion of Cu to suppress the formation of voids and, consequently, the reliability of the bonding part is enhanced. However, it is unavoidable that an Au—Sn alloy having a high Sn content remains locally in the bonding part and voids are possible to grow from portions of the bonding part having a high Sn content.

SUMMARY OF THE INVENTION

The present invention has been made in view of such problems and it is therefore an object of the present invention to provide a semiconductor device that enables firm bonding of Au bumps to Cu leads, a method of fabricating such a semiconductor device and a copper lead.

A semiconductor device in a first aspect of the present invention comprises a semiconductor chip, an Au bump formed on the semiconductor chip, and a Cu lead bonded by a bonding part to the Au bump, in which the Cu lead has a Cu core and a plated Sn layer formed on the Cu core, and the bonding part is formed of an Au—Cu—Sn alloy of a ternary system.

A semiconductor device in a second aspect of the present invention comprises a semiconductor chip, an Au bump formed on the semiconductor chip, and a Cu lead bonded by a bonding part to the Au bump, in which the Cu lead comprises a Cu core and a plated Sn layer formed on the Cu core, and an Au—Cu alloy of a binary alloy system is formed in the bonding part.

A Cu lead in a third aspect of the present invention comprises a Cu core and a plated Sn layer formed on the Cu core, and has an inner lead and an outer lead, in which the thickness of the plated Sn layer of the inner lead is in the range of 0.15 to 0.35 $\mu$m.

A method of fabricating a semiconductor device in a fourth aspect of the present invention comprises the steps of: preparing a semiconductor chip provided with an Au bump, and bonding a Cu lead having a Cu core and a plated Sn layer formed on the Cu core to the Au bump; so that a bonding part of an Au—Cu—Sn alloy having an Au-rich single-phase structure including 15 at. % or less Sn and 25 at. % or less Cu is formed between the Au bump and the corresponding Cu lead.

A method of fabricating a semiconductor device in a fifth aspect of the present invention comprises the steps of: preparing a semiconductor chip provided with an Au bump, bonding Cu lead comprising a Cu core and a plated Sn layer formed on the Cu core to the Au bumps, and keeping the Au bump and the Cu lead at a predetermined temperature for a given time, so that a bonding part of an Au—Cu alloy of a substantially binary alloy system is formed between the Au bump and the corresponding Cu lead.

According to the first aspect of the present invention, Sn of the Au—Cu—Sn alloy of a ternary alloy system forming the bonding part between the Au bump and the Cu leads can be expelled from the bonding part when the semiconductor device is used for a long time in a working environment of an ordinary temperature or in a working environment of a high temperature to form an Au—Cu alloy of a binary alloy system in the bonding part.

According to the second aspect of the present invention, an Au—Cu—Sn alloy of a ternary alloy system can be formed in the bonding part when the Cu lead is bonded to the Au bump, because the thickness of the plated Sn layer of the inner lead is in the range of 0.15 to 0.35 $\mu$m.

According to the fourth aspect of the present invention, a firm, stable bonding part of an Au-rich Au—Cu—Sn alloy having a single-phase structure containing 15 at. % or less Sn and 25 at. % or less Cu can be formed between the Au bump and the Cu lead.

According to the fifth aspect of the present invention, a firm, stable bonding part of an Au-Cu alloy of a binary alloy system can be formed between the Au bump and the Cu lead.

The above and other objects, features and advantages of the present invention will become more apparent from the following description taken in connection with the accompanying drawings.

DETAILED DESCRIPTION OF THE PREFERRED EMBODIMENTS

Figure 15:
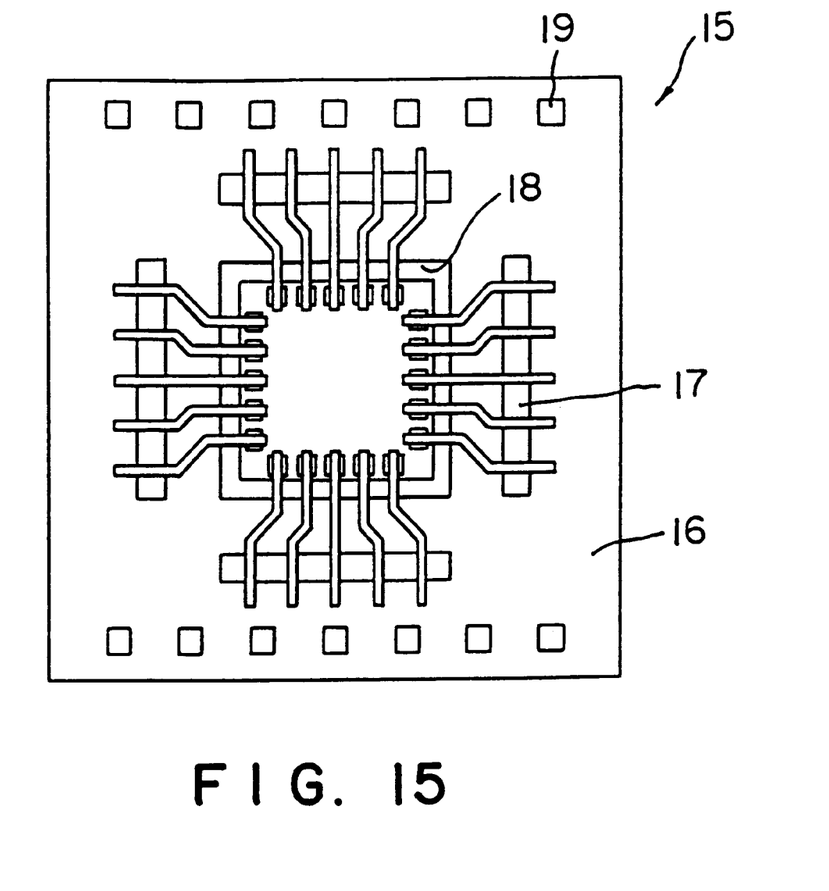
FIG. 15 is a plan view of the semiconductor device embodying the present invention.
Figure 16:
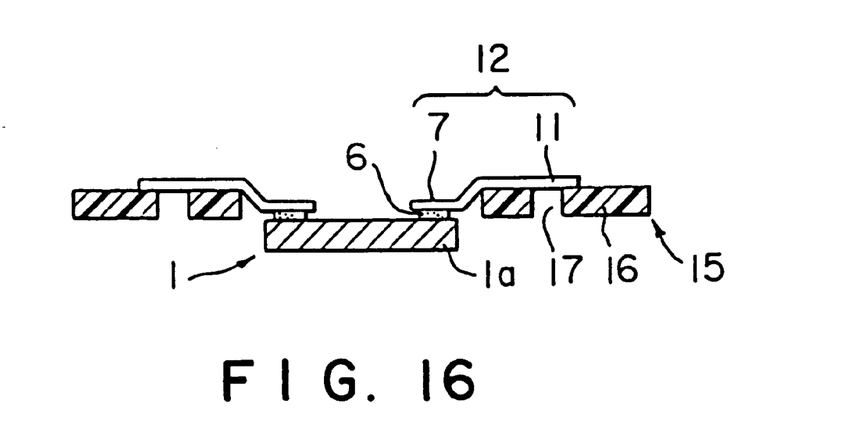
FIG. 16 is a sectional view of the semiconductor device shown in FIG. 15.

A semiconductor device in a preferred embodiment according to the present invention will be generally described with reference to FIGS. 15 and 16. A semiconductor device 1 in accordance with the present invention comprises a semiconductor chip 1a, Au bumps 6 formed on the semiconductor chip 1a, and Cu leads 12 bonded to the Au bumps 6, respectively. Each Cu lead 12 has an inner lead 7 bonded to the Au bump 6, and an outer lead 11 connected to the inner lead 7.

The Cu leads 12 are arranged beforehand on a resin film 16. The Cu leads 12 and the resin film 16 constitute a TAB tape 15. The resin film 16 of the TAB tape 15 is provided with outer lead holes 17 across which the outer leads 11 extend, a device hole 18 in which the semiconductor chip 1a is disposed, and tooling holes 19 for tape feeding and positioning. After the semiconductor chip 1a has been connected to the TAB tape 15, the TAB tape 15 is cut along the outer lead holes 17 to separate the semiconductor device 1 from the TAB tape 15, and the semiconductor device 1 is mounted on a printed wiring board, not shown.

Figure 1:
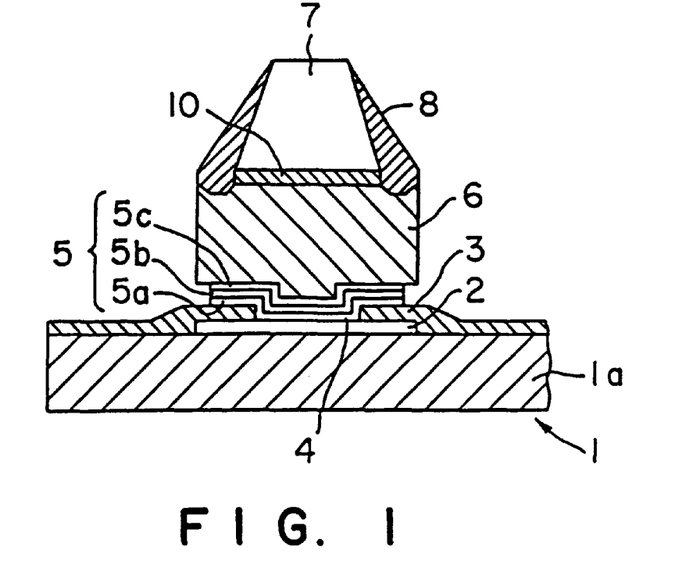
FIG. 1 is a fragmentary sectional view of a semiconductor device in a preferred embodiment according to the present invention.

Referring to FIG. 1, the semiconductor chip 1a of the semiconductor device 1 is provided with electrode pads 2 of aluminum, and the surface of the semiconductor device 1 on which the electrode pads 2 are formed is coated entirely with a passivation film 3 of $SiN_4$ or $SiO_2$. The passivation film 3 is provided with openings 4 at positions corresponding to the electrode pads 2 to expose the electrode pads 2 partially through the openings 4.

A barrier metal layer 5 is formed so as to cover the exposed surface of each electrode pad 2 and an area of the passivation film 3 around the edge of the opening 4. Generally, the barrier metal layer 5 consists of a plurality of metal thin films. The barrier metal layer 5 shown in FIG. 1 is formed by sequentially forming a first barrier metal layer 5a of Ti, a second barrier metal layer 5b of Ni and a third barrier metal layer 5c of Pd. The bump 6 is formed on the third barrier metal layer 5c. The bumps 6 of semiconductor devices to be mounted on a TAB tape by a TAB method are formed of Au.

Figure 19:
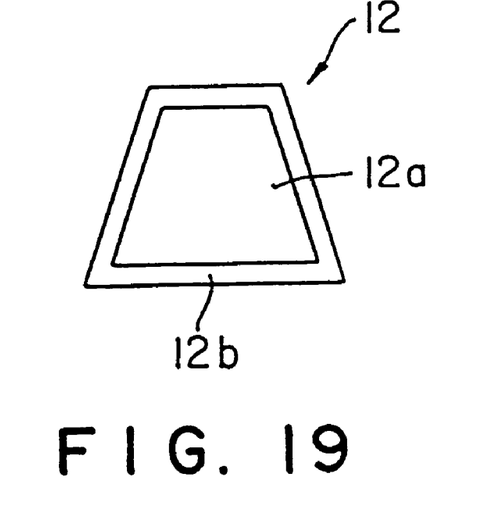
FIG. 19 is a sectional view of a Cu lead.

The inner lead 7 of the Cu lead 12 is bonded to the Au bump 6 by an ILB process. As shown in FIG. 19, the Cu lead 12 consists of a Cu core 12a and a plated Sn layer 12b formed on (coating) the Cu core 12a. The plated Sn layer 12b is formed by an electroless plating process. The thickness of a first portion of the plated Sn layer 12b coating the Cu core 12a of the inner lead 7 and that of a second portion of the same coating the Cu core 12a of the outer lead 11 are different from each other; the respective thicknesses of the first and the second portion of the plated Sn layer 12b measured by a coulometric thickness meter are in the range of 0.15 to 0.35 µm and in the range of 0.4 to 0.6 µm, respectively. Since the second portion of the plated Sn layer 12b coating the Cu core 12a of the outer lead 11 has a comparatively large thickness in the range of 0.4 to 0.6 µm, Cu will not appear on the surface of the outer lead 11 during outer lead bonding (OLB), as a result of that the Cu core 12a will not be oxidized and therefore moderate wettability can be secured. Incidentally, in the case of OLB with an aeolotropic. conductive film, the thickness of the plated Sn layer 12b of the outer lead 11 may be less than 0.4 µm.

When forming the Cu lead 12, the plated Sn layer 12b is subjected to heat treatment immediately after being formed on the surface of the Cu core 12a to make Sn of the plated Sn layer 12b diffuse into the Cu core 12a.

Figure 2:
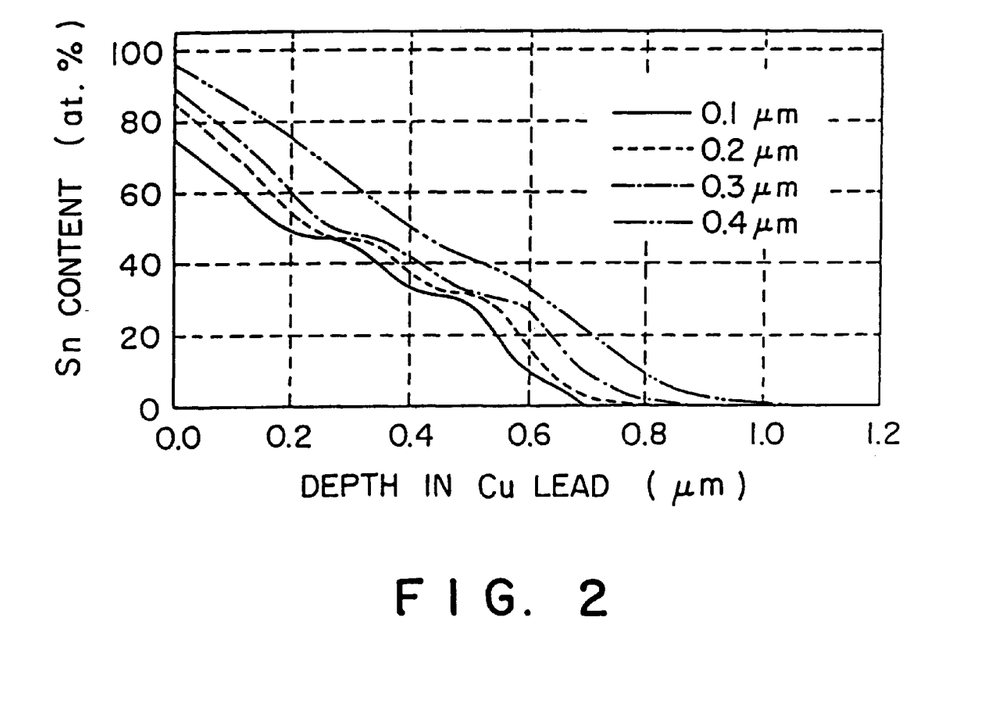
FIG. 2 is a graph showing the variation of Sn content with depth in Cu leads coated with plated Sn layers of different thicknesses, respectively, determined by Rutherford backscattering spectrometry.

FIG. 2 is a graph showing the variation of Sn content of the Cu leads 12 having plated Sn layers 12b of different thicknesses of 0.1 to 0.4 µm respectively, with depth from the surface measured immediately after heat-processing the Cu leads 12 after forming the plated Sn layers 12b by Rutherford backscattering spectroscopy. As is obvious from FIG. 2, the Sn content of the surface of each plated Sn layer 12b of a thickness of 0.4 pm or below is less than 100 at. %, which proves that Cu is present in the surface of the plated Sn layer 12b.

As mentioned above, the thickness of the first portion of the plated Sn layer 12b coating the Cu core 12a of the inner lead 7 is in the range of 0.15 to 0.35 µm and, in the first portion of the plated Sn layer 12b, the ratio of Cu to Sn in atomic percent on the surface of the plated Sn layer 12b is 5:95 to 25:75 (FIG. 2). The thickness of the second portion of the plated Sn layer 12b coating the Cu core 12a of the outer lead 11 is in the range of 0.4 to 0.6 µm and, in the second portion of the plated Sn layer 12b, the ratio of Cu to Sn in atomic percent on the surface of the plated Sn layer 12b is 0:100 to 5:95 (FIG. 2).

A method of fabricating the semiconductor device 1 will be described hereinafter. The electrode pads 2 are formed on the semiconductor chip 1a. The barrier metal layers 5 and the Au bumps 6 are formed in that order on the electrode pads 2, respectively. The inner leads 7 of the Cu leads 12 each formed by coating the Cu core 12a with the plated Sn layer 12b are brought into contact with the Au bumps 6, respectively, and heat and pressure are applied to the inner leads 7 for ILB to bond the inner leads 7 to the Au bumps 6, respectively. When the inner leads 7 are thus bonded to the Au bumps 6, fillets 8 are formed on the side surfaces of each inner lead 7, and an alloy layer (bonding part) 10 is formed in the interface between the inner lead 7 and the Au bump 6. The fillets 8 and the alloy layer 10 secure bonding strength between the inner lead 7 and the Au bump 6.

Figure 3:
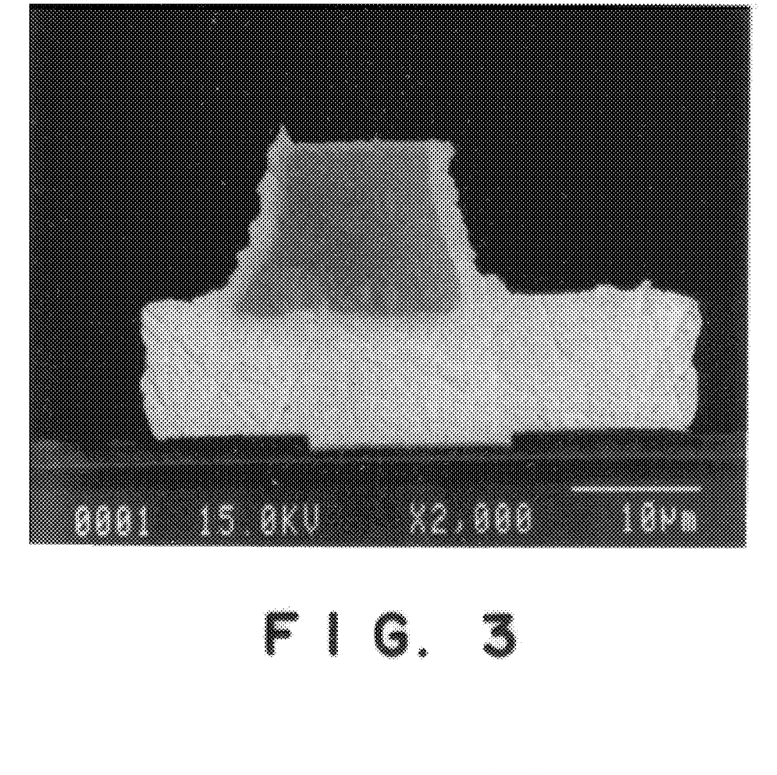
FIG. 3 is a photograph of a section of a bonding part formed between a bump and an inner lead by ILB.
Figure 4:
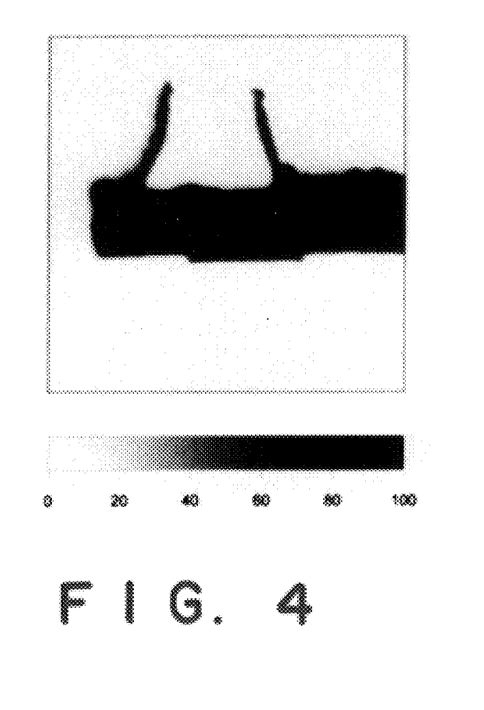
FIG. 4 is a photograph showing the distribution of Au in the bonding part shown in FIG. 3.
Figure 5:
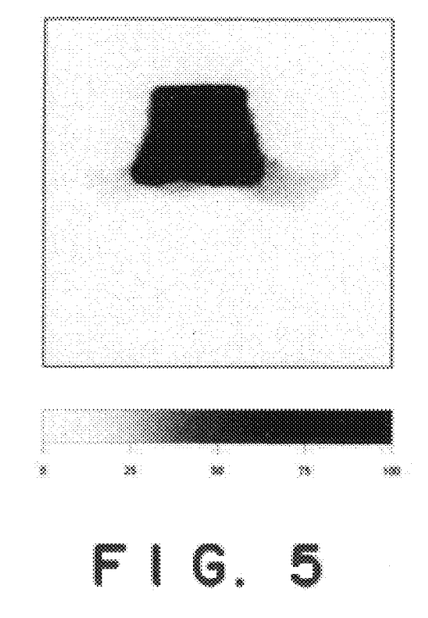
FIG. 5 is a photograph showing the distribution of Cu in the bonding part shown in FIG. 3.
Figure 6:
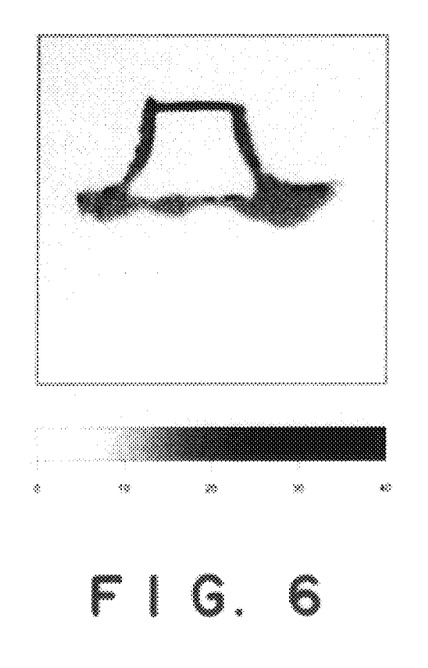
FIG. 6 is a photograph showing the distribution of Sn in the bonding part shown in FIG. 3.

FIG. 3 is a photograph of a section of the bonding part 10 between the Au bump 6 and the inner lead 7 taken by scanning electron microscopy (SEM), and FIGS. 4, 5 and 6 are photographs showing the respective distributions of Au, Cu and Sn, respectively, in the alloy layer 10 between the Au bump 6 and the inner lead 7. In FIGS. 4, 5 and 6, numerals indicate contents in percent by weight, darker areas correspond to regions having a higher content, and lighter areas correspond to regions having a lower content. A temperature of 500° C. and a pressure of 70 MPa are conditions for the ILB of the inner lead 7 to the Au bump 6. The thickness of the plated Sn layer 12b of the inner lead 7 is 0.28 µm. As is obvious from FIGS. 3 to 6, the three elements, i.e., Au, Cu and Sn, are present in the fillets 8 and the alloy layer part 10. Results of point analysis of the fillets 8 and the alloy layer 10 are shown in Table 1.

TABLE 1

| Position | Au | Cu | Sn |
| --- | --- | --- | --- |
| Fillet | 60.1 | 9.8 | 28.7 |
| Alloy layer | 61.9 | 24.2 | 14.1 |

As is evident from Table 1, the Au/Sn ratio of the composition of the fillet 8 is nearly equal to that of an eutectic alloy, and the alloy layer 10 is an Au—Cu—Sn alloy of a ternary system.

Thus the alloy layer 10 of an Au—Cu—Sn alloy of a ternary system is formed when the inner lead 7 is bonded to the Au bump 6 by ILB because the plated Sn layer 12b of the inner lead 7 has a comparative small thickness in the range of 0.15 to 0.35 µm and hence Cu appears from the Cu lead core 12a to the surface of the plated Sn layer 12b in a Cu content of 5 to 25% at. The composition Au:Cu:Sn in atomic percent of the alloy forming the alloy layer 10 is 61.9:24.2:14.1 and the alloy of the alloy layer 10 is not a eutectic alloy but is an Au-rich simple alloy. Experiments showed that such an Au-rich simple alloy can be obtained when the Cu content is 25% at. or below and the Sn content is 15 at. % or below. Since Sn is comparatively unstable in an Au-rich alloy, Sn is expelled from the alloy layer 10 when the semiconductor device 1 is kept at a high temperature or at an ordinary temperature for a long time.

Figure 7:
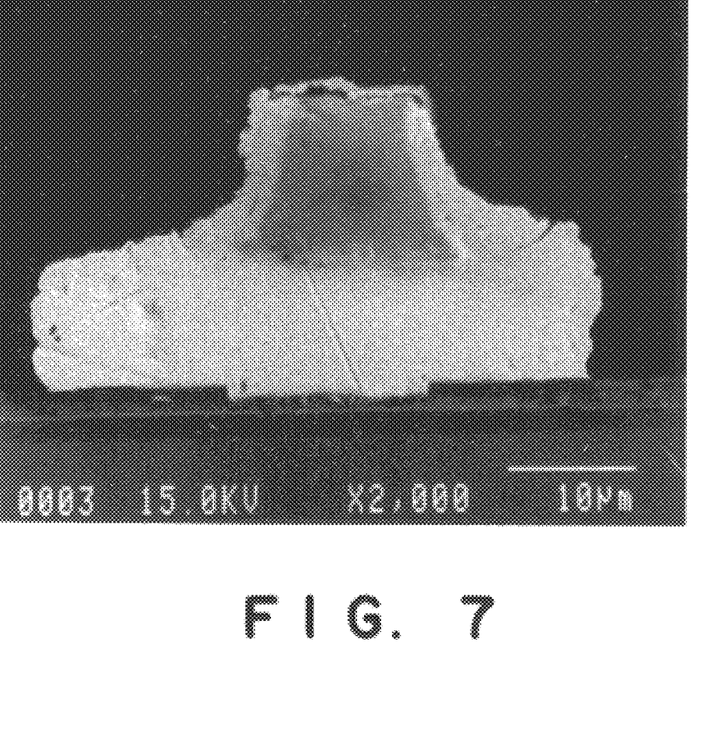
FIG. 7 is a photograph showing the metallographic structure of the bonding part after being kept at 200° C. for 240 h.
Figure 8:
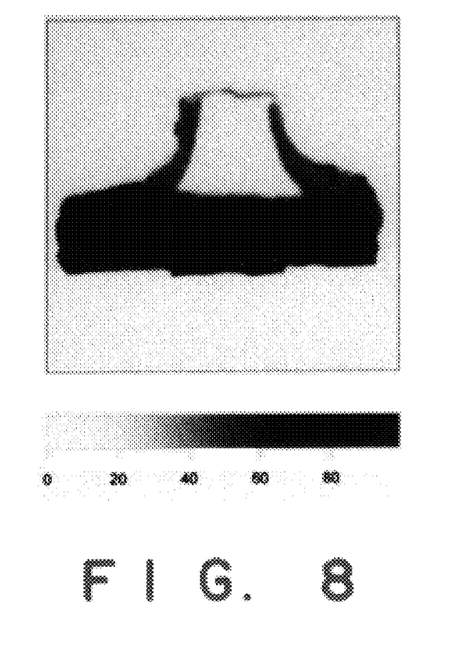
FIG. 8 is a photograph showing the distribution of Au in the bonding part shown in FIG. 7.
Figure 9:
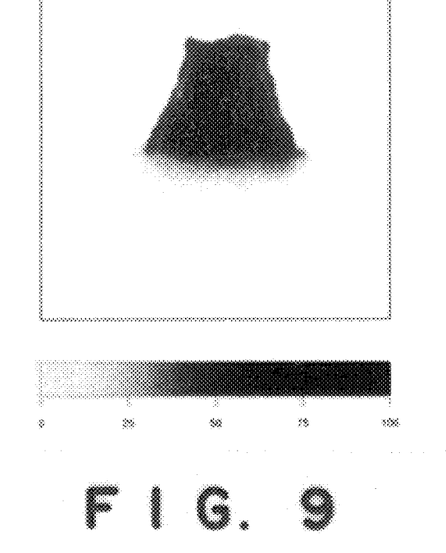
FIG. 9 is a photograph showing the distribution of Cu in the bonding part shown in FIG. 7.
Figure 10:
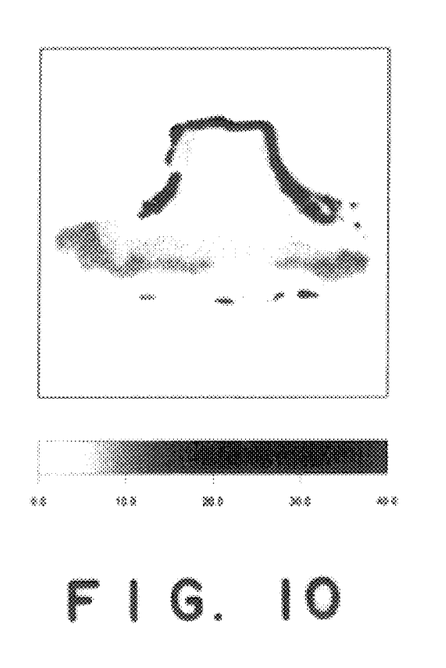
FIG. 10 is a photograph showing the distribution of Sn in the bonding part shown in FIG. 7.

Changes that occur when the semiconductor device 1 is kept at a high temperature for a long time will be described. FIG. 7 is a photograph showing a section of the alloy layer 10 and its vicinity shown in FIGS. 3 to 6 in the semiconductor device 1 after the semiconductor device 1 has been kept at 200° C. for for 240 h, and FIGS. 8, 9 and 10 are photographs showing the distributions of Au, Cu and Sn in the bonding part 10 between the Au bump 6 and the inner lead 7 after the semiconductor device 1 has been kept at 200° C. for 240 h. In FIGS. 8 to 10, figures indicate content in percent by weight, darker areas correspond to regions having a higher content, and lighter areas correspond to regions having a lower content. As is evident from FIGS. 7 to 10, Sn is expelled from the alloy layer 10 between the Au bump 6 and the inner lead 7 and diffuses into the Au bump 6 when the semiconductor device 1 is kept at 200° C. for 240 h; consequently, the Sn content of the alloy layer 10 is reduced and an Au—Cu alloy of a binary system is formed.

Figure 17:
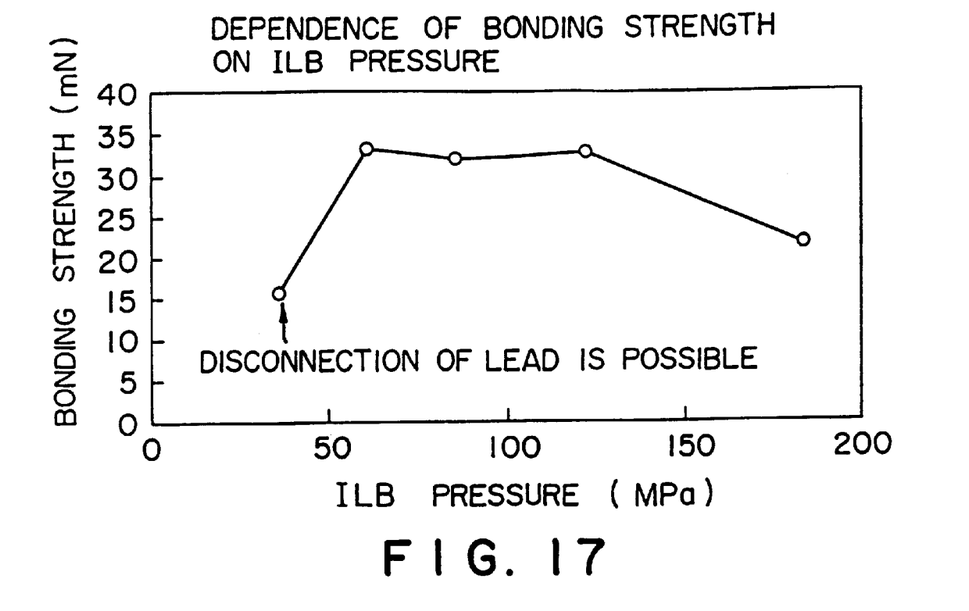
FIG. 17 is a graph showing the dependence of bonding strength on ILB pressure.

Diffusion of Au and Cu is moderate as compared with that of Sn and voids are formed hardly by the Kirkendall effect. Thus, highly reliable bonding of the Au bump 6 and the inner lead 7 can be achieved. The Au—Cu alloy forming the alloy layer 10 may contain Sn in a small Sn content of, for example, 5 at. % or below. As is evident from FIG. 17 showing the dependence of the bonding strength of the alloy layer 10 on ILB pressure, an Au—Cu—Sn alloy of a ternary system having a high bonding strength can be formed in the alloy layer 10 during the ILB of the inner lead 7 to the Au bump 6 when the ILB pressure is 50 MPa or above. The thickness of the plated Sn layers 12$b$ of sample inner leads subjected to experiments for obtaining the results shown in FIG. 17 is 0.25 $\mu$m and the ILB temperature for forming sample alloy layers for obtaining the results shown in FIG. 17 is 500° C. If the thickness of the plated Sn layer 12$b$ is 0.15 $\mu$m or below, the Cu content on the surface of the inner lead 7 is excessively high and any satisfactory alloy cannot be formed by ILB. If the thickness of the plated Sn layer 12$b$ measured by a coulometric thickness meter is greater than 0.35 $\mu$m, Cu is hardly able to appear to the surface of the inner lead 7 and, consequently, an alloy of a ternary system cannot be formed.

If the depth of diffusion of Sn from the surface of the plated Sn layer 12$b$ in the inner lead 7 is greater than 1.2 $\mu$m, surplus Sn collects at the lead neck during ILB and may possibly cause accidental connection between the adjacent inner leads 7. Therefore, the depth of diffusion of Sn is, desirably, 1.2 $\mu$m or below.

Figure 18:
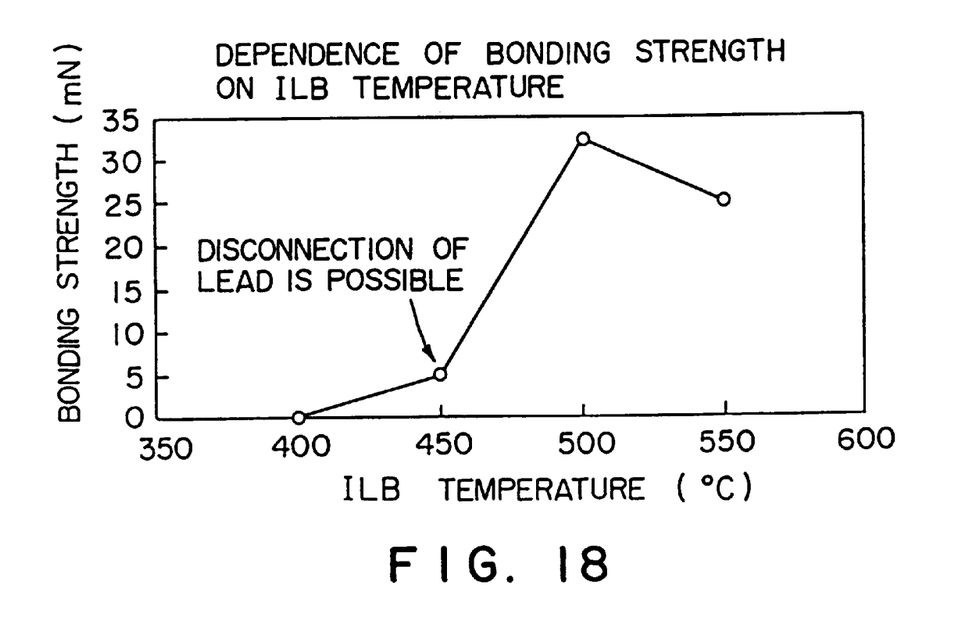
FIG. 18 is a graph showing the dependence of bonding strength on ILB temperature.

As is evident from FIG. 18 showing the dependence of the bonding strength of the alloy layer 10 on ILB temperature, it is difficult to form a satisfactory alloy layer 10 when the ILB temperature is lower than 450° C. The thickness of the plated Sn layers 12$b$ of sample inner leads subjected to experiments for obtaining the results shown in FIG. 18 is 0.25 $\mu$m and the ILB pressure for forming sample alloy layers for obtaining the results shown in FIG. 17 is 70 MPa. As shown in FIG. 18, the bonding strength of the alloy layer 10 decreases when the ILB temperature increased beyond 550° C., which is inferred to be due to the excessive formation of an alloy at the neck of the inner lead 7. Therefore, the ILB temperature must be in the range of 450° C. to 550° C.

Figure 11:
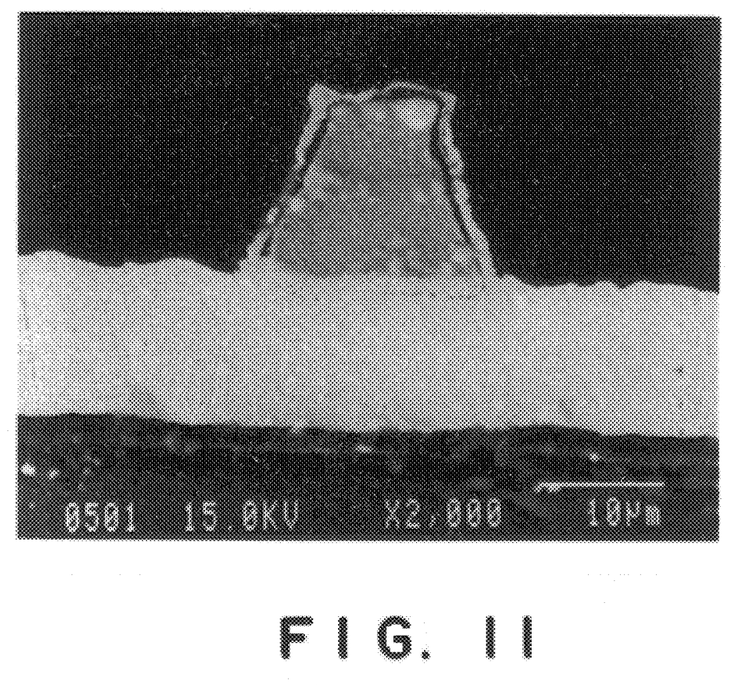
FIG. 11 is a photograph showing the metallographic structure in a section of a bonding part after the bonding part has been kept at 200° C. for 720 h.
Figure 12:
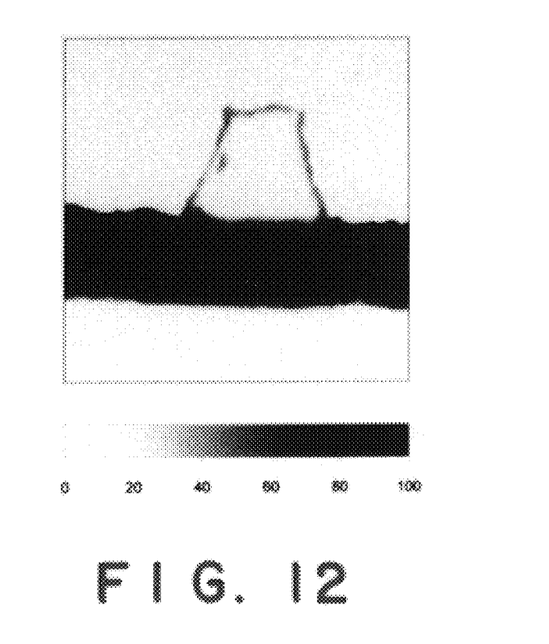
FIG. 12 is a photograph showing the distribution of Au in the region shown in FIG. 11.
Figure 13:
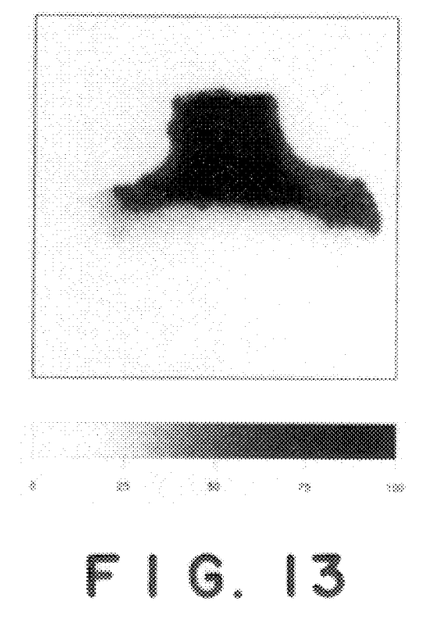
FIG. 13 is a photograph showing the distribution of Cu in the region shown in FIG. 11.
Figure 14:
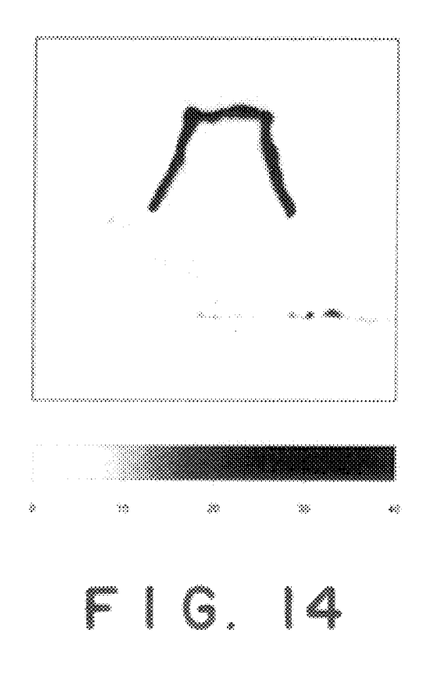
FIG. 14 is a photograph showing the distribution of Sn in the region shown in FIG. 11.

Changes that occur when the semiconductor device 1 is kept at 200° C. for 720 h will be described with reference to FIGS. 11 to 14. Conditions for the ILB of an inner lead having a 0.28 $\mu$m thick plated Sn layer to an Au bump are 500° C. in ILB temperature and 70 MPa in ILB pressure. FIG. 11 is a photograph showing the metallographic structure of a bonding part after the bonding part has been kept at 200° C. for 720 h and FIGS. 12, 13 and 14 are photographs showing the distribution of Au, Cu and Sn in an alloy layer 10 shown in FIG. 11. In FIGS. 12 to 13, figures indicate content in percent by weight, darker areas correspond to regions having a higher content, and lighter areas correspond to regions having a lower content. As is evident from FIGS. 11 to 14, Sn is expelled from the alloy layer 10 and diffuses through the Au bump 6 to the barrier metal layer 5. In this case Sn may possibly interact with the Al electrode pad 2. The diffusion of Sn into the Al electrode pad 2 can be stopped by a barrier metal layer 5 containing Ti. Thus, Sn can be expelled from the alloy layer 10 between the inner lead 7 and the Au bump 6 and the alloy layer 10 can be formed of an Au—Cu alloy of a binary system by keeping the semiconductor device 1 at 200° C. for 720.

It is also possible to expel Sn from the alloy layer 10 to form an Au—Cu alloy of a binary system in the alloy layer 10 by keeping the semiconductor device 1 at an ordinary temperature for a long time, i.e., by using the semiconductor device at an ordinary temperature for an extended time.

Suppose that activation energy which must be added to the alloy layer 10 to allow a reaction through which the Au—Cu—Sn alloy changes into an Au—Cu alloy of a binary system is 0.37 eV mentioned in the paper of Zakel, et al. as activation energy necessary for activating an Au—Cu—Sn alloy. Then, an Au—Cu alloy of a binary system is formed in the bonding area in about five years if the ambient temperature is 25° C. and the temperature of the alloy layer 10 is 50° C. while the semiconductor device 1 is in operation or in about one year if the ambient temperature is 25° C. and the temperature of the alloy layer 10 is 100° C. while the semiconductor device 1 is in operation.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A semiconductor device comprising:
   a semiconductor chip;
   an Au bump formed on the semiconductor chip; and
   a Cu lead bonded to the Au bump through a bonding part;
   wherein said Cu lead has a Cu core and a plated Sn layer formed on the CU core, and said bonding part is formed by bonding the Cu lead to the Au bump so that the bonding part directly contacts with the Cu lead and the Au bump, and said bonding part is formed of an Au—CU—Sn alloy of a ternary system.

2. A semiconductor device comprising:
   a semiconductor chip;
   an Au bump formed on the semiconductor chip; and
   a Cu lead bonded to the Au bump through a bonding part;
   wherein said Cu lead has a Cu core and a plated Sn layer formed on the Cu core, and said bonding part is formed by bonding the Cu lead to the Au bump, said bonding part consisting essentially of an Au—Cu alloy of a binary system.

3. A Semiconductor device according to claim 2, wherein said Cu lead has an inner lead bonded through the bonding part to the Au bump, and an outer lead connected to the inner lead.

* * * * *

UNITED STATES PATENT AND TRADEMARK OFFICE
CERTIFICATE OF CORRECTION

PATENT NO.:    6,049,130
DATED:         April 11, 2000
INVENTORS:     Eiichi HOSOMI et al.

It is certified that errors appear in the above-identified patent and that said Letters Patent is hereby corrected as shown below:

In claim 1, column 8, line 47, replace "CU core" with --Cu core--.
            line 51, replace "Au-CU-Sn alloy" with --Au-Cu-Sn alloy--.

In claim 3, column 8, line 62, replace "A Semiconductor" with --A semiconductor--.

Signed and Sealed this

Seventeenth Day of April, 2001

NICHOLAS P. GODICI

*Attest:*

*Attesting Officer*        Acting Director of the United States Patent and Trademark Office